US009093789B2

(12) United States Patent
Aoki

(10) Patent No.: US 9,093,789 B2
(45) Date of Patent: Jul. 28, 2015

(54) CONTROLLING DEVICE

(71) Applicant: Azbil Corporation, Tokyo (JP)

(72) Inventor: Takanori Aoki, Tokyo (JP)

(73) Assignee: AZBIL CORPORATION, Tokyo (JP)

( * ) Notice: Subject to any disclaimer, the term of this patent is extended or adjusted under 35 U.S.C. 154(b) by 42 days.

(21) Appl. No.: 13/950,685

(22) Filed: Jul. 25, 2013

(65) Prior Publication Data

US 2014/0030909 A1      Jan. 30, 2014

(30) Foreign Application Priority Data

Jul. 25, 2012   (JP) ................. 2012-164401

(51) Int. Cl.
| | |
|---|---|
| *H01R 13/641* | (2006.01) |
| *G01R 33/038* | (2006.01) |
| *H01R 13/639* | (2006.01) |
| *H01R 13/70* | (2006.01) |
| *H01R 9/24* | (2006.01) |
| *H01R 13/627* | (2006.01) |
| *H01R 13/66* | (2006.01) |

(52) U.S. Cl.
CPC ............ *H01R 13/641* (2013.01); *G01R 33/038* (2013.01); *H01R 13/639* (2013.01); *H01R 13/701* (2013.01); *H01R 9/24* (2013.01); *H01R 13/6272* (2013.01); *H01R 13/6658* (2013.01)

(58) Field of Classification Search
CPC ....... H01R 9/00; H01R 13/625; H01R 13/641
USPC ............ 439/489, 347, 38, 39, 911, 709
See application file for complete search history.

(56) References Cited

U.S. PATENT DOCUMENTS 5,542,425 A * 8/1996 Marshall et al. .............. 600/437
6,768,643 B1 * 7/2004 Rust et al. .................... 361/732

FOREIGN PATENT DOCUMENTS

| JP | 2002-203616 A | 7/2002 |
|---|---|---|
| JP | 2010-146958 A | 7/2010 |

* cited by examiner

*Primary Examiner* — Abdullah Riyami
*Assistant Examiner* — Thang Nguyen
(74) *Attorney, Agent, or Firm* — Troutman Sanders LLP

(57) ABSTRACT

A controlling device includes a controlling device main unit, a terminal block removably attached to the controlling device main unit, and a lock mechanism. The terminal block attached to the controlling device main unit is locked through the movement of a slide member provided with the controlling device main unit. The slide member includes a permanent magnet disposed in a specific position. The controlling device main unit includes a magnetism detecting portion that detects magnetism of the permanent magnet, located in a location in proximity to the permanent magnet, disposed in the slide member, in a state wherein terminal block is locked through movement of the slide member, and a lock status confirming portion that confirms whether or not the terminal block is in a locked state, based on a detection signal from the magnetism detecting portion indicating whether or not magnetism is present.

1 Claim, 8 Drawing Sheets

CONTROLLING DEVICE

CROSS REFERENCE TO RELATED APPLICATION

The present application claims priority under 35 U.S.C. §119 to Japanese Patent Application No. 2012-164401, filed Jul. 25, 2012, the entire content of which being hereby incorporated herein by reference.

FIELD OF TECHNOLOGY

The present invention relates to a controlling device comprising a lock mechanism that locks, by moving a slide member, a terminal block that is attached to a controlling device main unit.

BACKGROUND

Controlling devices, such as temperature adjusting instruments, communication devices, display devices, driving devices, input/output devices, and power supply devices, are equipped with terminal blocks for inputting power and signals from sensors, or the like, and for outputting signals to the devices that are controlled. In recent years, structures wherein the terminal blocks can be removed from the controlling device main units have been used in order to enhance convenience in operations at the time of maintenance operations, and to accommodate miniaturization of the equipment.

For example, Japanese Unexamined Patent Application Publications 2002-203616 and 2010-146958 ("the JP '616" and "the JP '958", respectively) disclose controlling devices that use such structures. The controlling devices shown in the JP '616 and the JP '958 are provided lock mechanisms that lock, by moving a slide member, terminal blocks that are attached to a controlling device main unit. That is, the terminal block that is attached to the controlling device main unit is locked or unlocked through the movement of a slide member.

However, in a controlling device provided with the lock mechanism described above, if one forgets to lock the terminal block, then there will be the risk that the terminal block will fall out due to vibration or physical shock. Moreover, if the slide member were to move for some reason, then the terminal block would become unlocked, with the risk that the terminal block would fall out due to vibration or physical shock.

The present invention was created in order to solve the problem as set forth above, and an aspect thereof is to provide a controlling device able to detect if a terminal block is in a locked or unlocked state, and able to provide notification.

SUMMARY

A controlling device is provided with a controlling device main unit, a terminal block that is attached removably to the controlling device main unit, and a lock mechanism. The terminal block that is attached to the controlling device main unit is locked through the movement of a slide member. The slide member includes a permanent magnet disposed in a specific position. The controlling device main unit includes a magnetism detecting portion that detects magnetism of the permanent magnet, located in a location in proximity to the permanent magnet, disposed in the slide member, in a state wherein terminal block is locked through movement of the slide member, and a lock status confirming portion that confirms whether or not the terminal block is in a locked state, based on a detection signal from the magnetism detecting portion indicating whether or not magnetism is present.

Given this, when the terminal block is locked through movement of the slide member, the permanent magnet that is installed in the slide member approaches a magnetism detecting portion that is provided in the controlling device main unit. Through this, a signal indicating that magnetism of the permanent magnet has been detected is sent from the magnetism detecting portion to a lock status confirming portion, and the fact that the terminal block is in the locked state is confirmed.

In the present invention, in the lock status confirming portion, a check as to whether or not the terminal block is in a locked state is performed based on a detection signal from the magnetism detecting portion indicating whether or not magnetism is present. If, for example, the confirmation result of the lock status confirming portion is sent to a displaying portion, then it will be possible to discern, in the displaying portion, whether or not the terminal block is in a locked state. Moreover, a notification of the confirmation result by the lock status confirming portion may be sent, through communication, to an external device. Moreover, if it is confirmed, through the confirmation result by the lock status confirming portion, that the terminal block is not in a locked state, then functions for various types of signal processing between the controlling device main unit and the terminal block may be stopped.

Given the present invention, a permanent magnet is disposed in a specific location of the slide member, and the controlling device main unit is provided with a magnetism detecting portion for detecting magnetism of the permanent magnet in a location that is located near the permanent magnet that is provided within the slide member, when the terminal block is in a locked state through the movement of the slide member, and provided with a lock status confirming portion for confirming, based on a detection signal from the magnetism detecting portion indicating whether or not magnetism is present, whether or not the terminal block is in a locked state, and thus states wherein the terminal block is unlocked for locked can be detected, and notification thereof may be provided.

DETAILED DESCRIPTION

Figure 1:
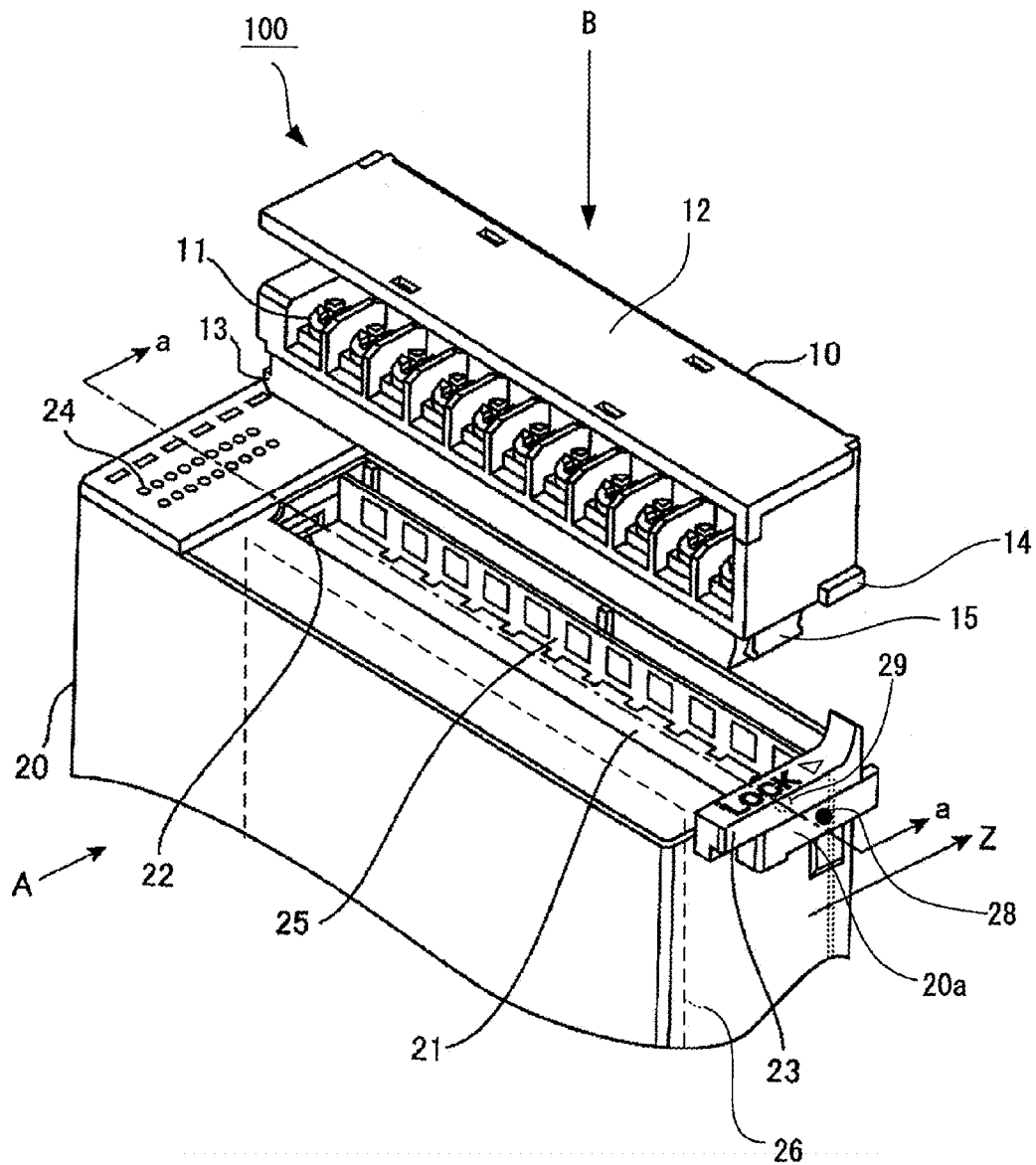
FIG. 1 is an assembly perspective diagram illustrating the structure of an example of a controlling device according to the present invention.

An example according to the present invention will be explained below in detail, based on the drawings. FIG. 1 is an assembly perspective diagram illustrating the structure of an example of a controlling device according to the present invention.

In the present example, the controlling device 100 is structured from a terminal block 10, having a plurality of terminal portions 11, and a controlling device main unit 20, having a terminal block attaching opening 21 for attaching the terminal block 10.

The terminal block 10 is provided with a plurality of terminal portions 11, and a terminal cover 12 for covering over the terminal portions 11, where a first protruding portion 13 is provided in the vicinity of the bottom face on one end in the lengthwise direction, and a second protruding portion 14 and a third protruding portion 15 are provided in the vicinity of the bottom face on the other end in the lengthwise direction. The first, second, and third protrusions 13, 14, and 15 are key-shaped or tab-shaped.

The controlling device main unit 20, on the inside of one lengthwise-direction end of the terminal block attaching opening 21, is provided with a fitting indentation 22 into which the first protruding portion 13 can fit, and is provided with a securing member 20a on the side face on the other lengthwise-direction end of the terminal block attaching opening 21. A slide member 23, which moves sliding in the direction of the arrow Z on the securing member 20a, to lock the terminal block 10 that is attached to the controlling device main unit 20 is provided on the top face of the securing member 20a. The slide member 23 is made from a non-magnetic material, and a permanent magnet 28 is embedded toward the bottom of the tip end portion in the direction of sliding (referencing FIG. 5 and FIG. 6). The installation location of the permanent magnet 28 in the slide member 23 is illustrated in FIG. 7. The locking of the terminal block 10 by the slide member 23 will be described below.

Moreover, a displaying portion 24 is provided on the top face of the controlling device main unit 20, and printed substrates 25 and 26 are contained on the inside of the controlling device main unit 20. In the printed substrate 25, a Hall IC 29, for detecting magnetism of the permanent magnet 28, is provided at a location that is located in proximity to the permanent magnet 28, provided in the slide member 23, when the terminal block 10 is in a locked state through the movement of the slide member 23. The Hall IC 29 corresponds to the magnetism detecting portions in the present invention.

Figure 2:
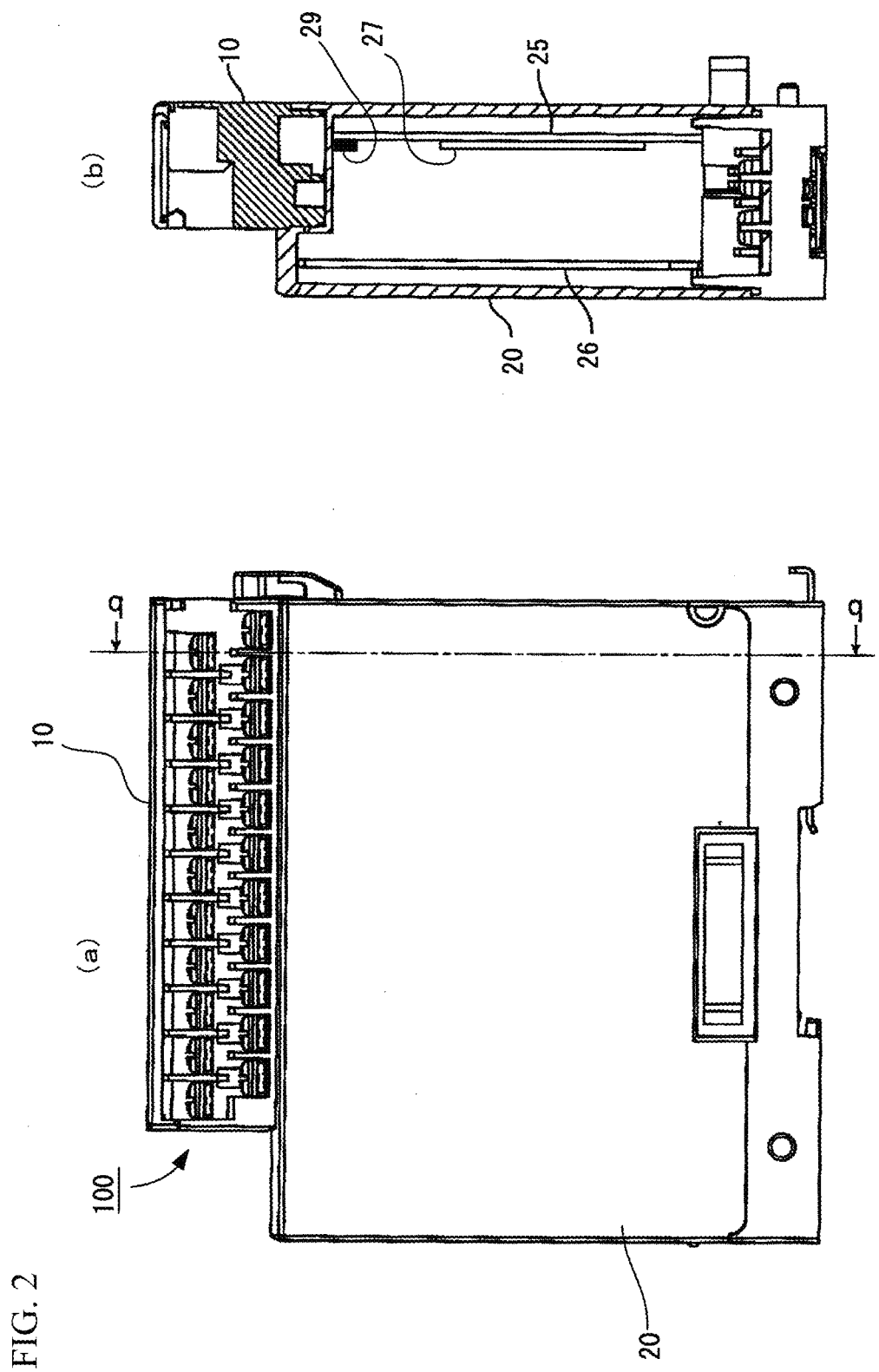
FIG. 2 is a side view diagram of the controlling device and a cross-sectional diagram illustrating schematically the structure of the internal portion thereof.

FIG. 2 is a side view of the controlling device 100 and a cross-sectional diagram illustrating the schematic structure of the interior thereof, where FIG. 2 (a) is a side view of the controlling device 100 when viewed from the A direction in FIG. 1, and FIG. 2 (b) is a cross-sectional diagram along the section b-b in FIG. 2 (a). A controlling portion 27, structured from a CPU, a microcontroller, or the like, is mounted on the printed substrate 25 that is contained within the controlling device main unit 20.

Attaching the Terminal Block to the Controlling Device Main Unit

Figure 3:
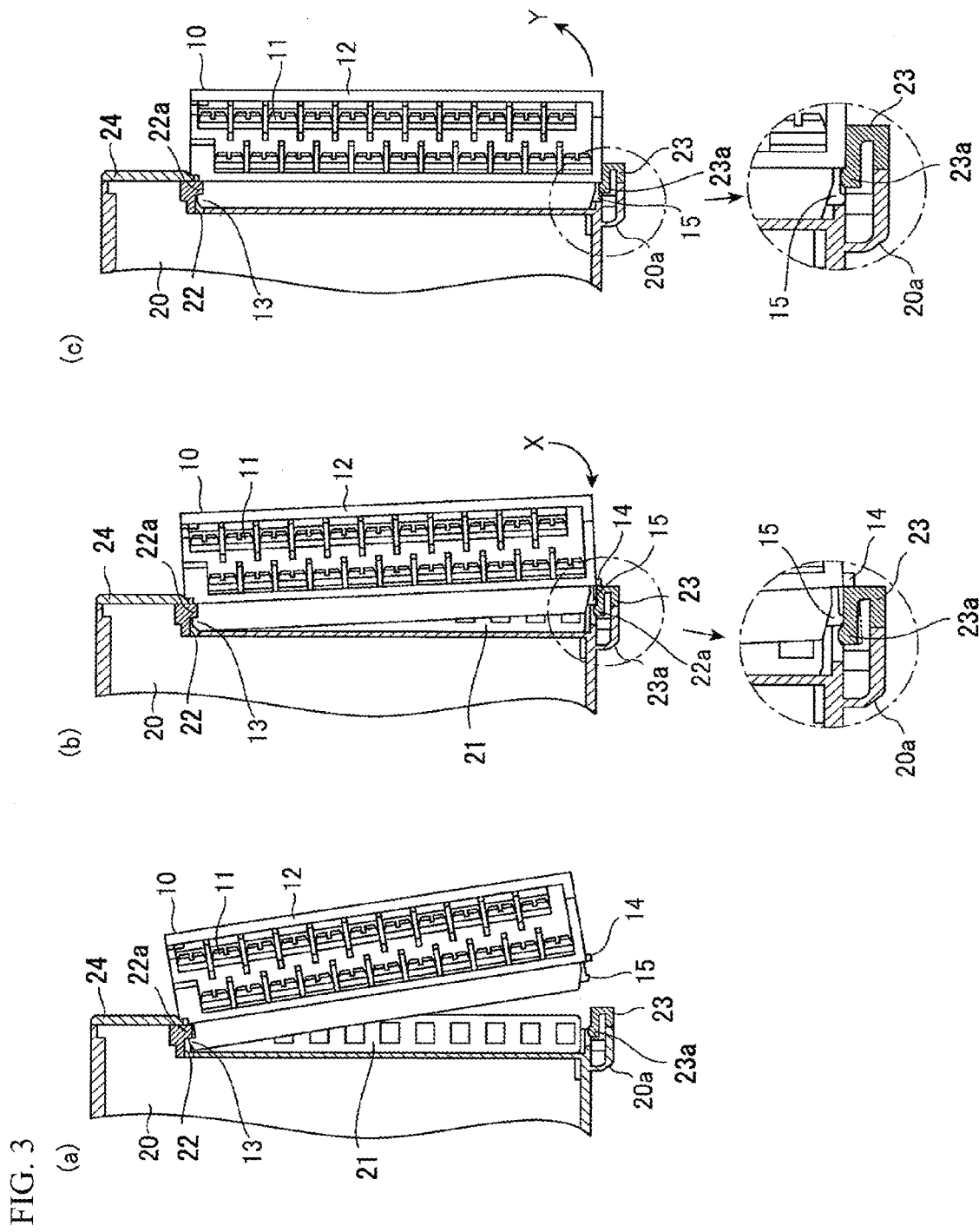
FIG. 3 is an explanatory diagram illustrating the procedure for attaching the terminal block to the controlling device main unit in the controlling device.

FIG. 3 is an explanatory diagram illustrating the procedure for attaching the terminal block 10 to the controlling device main unit 20, shown for the cross-sectional diagram along the section a-a in FIG. 1. The procedure for attaching the terminal block 10 to the controlling device main unit 20 is shown in the sequence from FIG. 3 (a) through (c).

First, as illustrated in FIG. 3 (a), the first protruding portion 13 that is provided on one lengthwise-direction end of the terminal block 10 is fitted into the fitting indentation 22 of the terminal block attaching opening 21. Following this, as illustrated in FIG. 3 (b), the bottom side end portion of the terminal block 10 is pushed in the direction of the arrow X.

The slide member 23 is provided on the securing member 20a on the side face on the other lengthwise-direction end of the terminal block attaching opening 21. The cross-sectional shape of this slide member 23 is essentially a block-U shape, and a locking portion 23a that protrudes toward the inside of the terminal block attaching opening 21 is formed on the end portion that has this block-U shape.

When the bottom side end portion of the terminal block 10 is pushed in the direction of the arrow X, the pressure causes the third protruding portion 15 of the terminal block 10 to push against the locking portion 23a of the slide member 23, and when pushed further, the locking portion 23a flexes as shown by the dotted line in the expanded view in FIG. 3 (b), enabling the third protruding portion 15 to go past the locking portion 23a. Thereafter, the release of the flexing of the locking portion 23a causes the key-shaped (tab-shaped) protrusion of the third protruding portion 15 to interlock with a protruding part of the locking portion 23a, to provisionally secure the terminal block 10 to the controlling device main unit 20.

The state wherein the terminal block 10 is provisionally secured to the controlling device main unit 20 is illustrated in FIG. 3 (c). When in this provisionally secured state, even if a force were to be applied to the terminal block 10 in the direction of the arrow Y, a catch portion 22a is formed between the fitting indentation 22 and the displaying portion 24, that is, on the side face of the fitting indentation 22 in the direction of removal of the terminal block 10, and thus the first protruding portion 13 would strike against the catch portion 22a, preventing the terminal block 10 from coming out in the direction of the arrow Y. Furthermore, because the key-shaped (tab-shaped) protrusion of the third protruding portion 15 interlocks with the protruding part of the locking portion 23a, the terminal block 10 is prevented even more reliably from coming out in the direction of the arrow Y.

Locking the Terminal Block by the Slide Member

Figure 4:
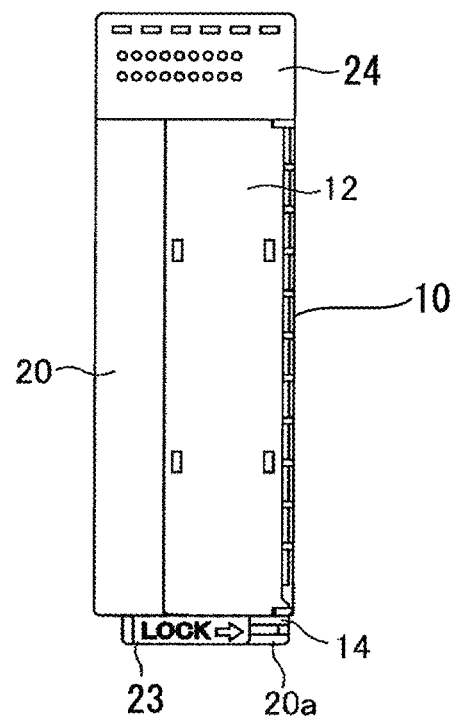
FIG. 4 is a diagram when the controlling device in a provisionally secured state is viewed from the direction of arrow B in FIG. 1.

FIG. 4 is a diagram viewing the controlling device 100, in the provisionally secured state, from the direction of the arrow B in FIG. 1. In the provisionally secured state, the slide member 23, as illustrated in FIG. 4, is positioned in the released state, enabling the second protruding portion 14 to be checked from above. When the slide member 23 that is in this released state is slid in the direction of the arrow Z in FIG. 1, the terminal block 10 that is attached to the controlling device main unit 20 is locked.

Figure 5:
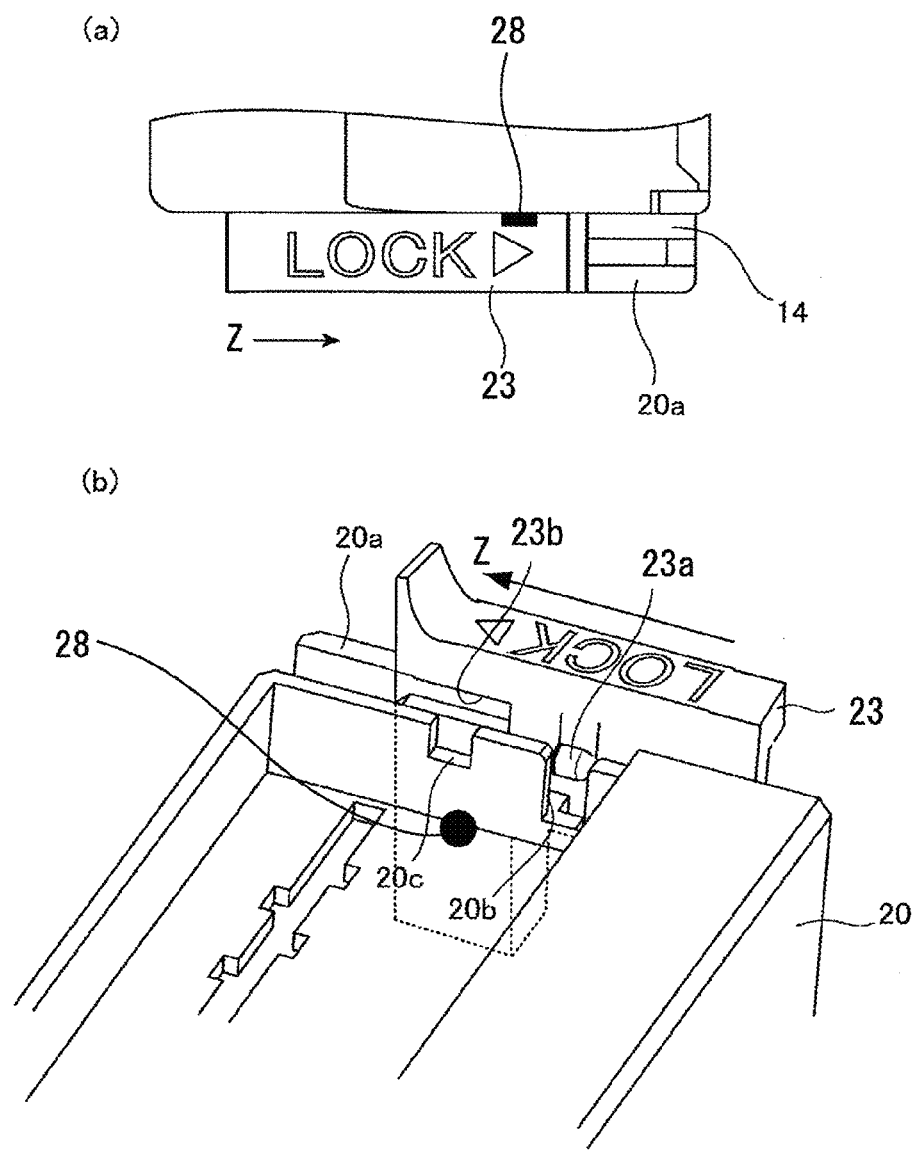
FIG. 5 is a diagram illustrating the state wherein the slide member is released in the controlling device.
Figure 6:
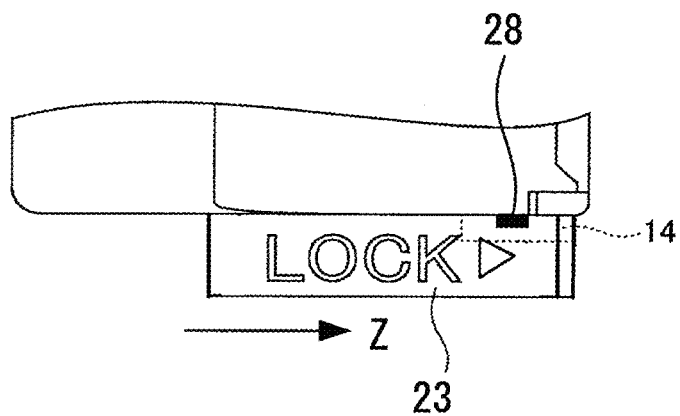
FIG. 6 is a diagram illustrating the state wherein the slide member is secured in the controlling device.
Figure 6:
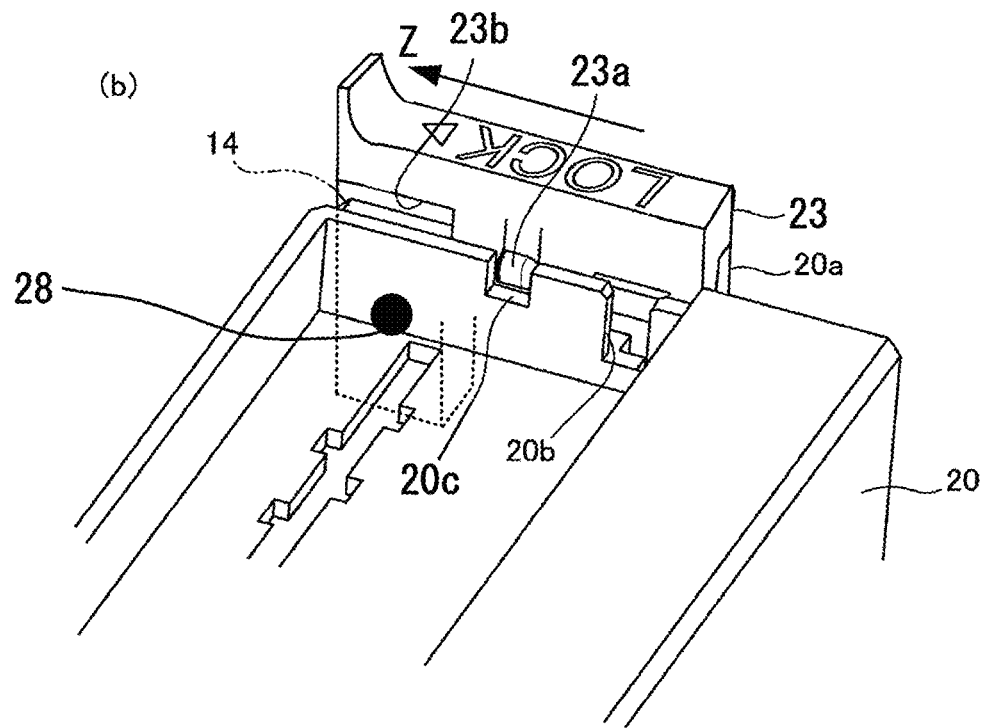
Figure 7:
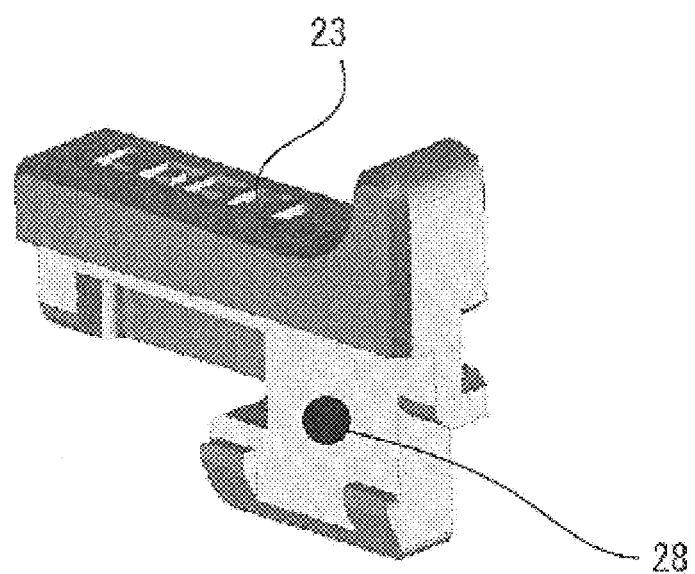
FIG. 7 is a perspective diagram illustrating the installation location of the permanent magnet in the slide in the controlling device.

FIG. 5 shows the released state of the slide member 23, and FIG. 6 shows the secured state of the slide member 23. FIG. 5 (a) and FIG. 6 (a) are diagrams showing the slide member 23 from above, and FIG. 5 (b) and FIG. 6 (b) are oblique views showing the securing member 20a, which includes the slide member 23, from the inside of the controlling device main unit 20.

A rectangular fitting groove portion 23b, into which the second protruding portion 14 can fit, is formed on the inside of the slide member 23. Furthermore, a rectangular release position groove 28b and lock position groove 20c, into which the locking portion 23a can fit, are formed in the side face of the controlling device main unit 20 wherein the slide member 23 is provided.

In the released state illustrated in FIG. 5, the locking portion 23a fits in the release position groove 20b, and the second protruding portion 14 is positioned to the outside of the slide member 23. In this released state, when the slide member 23 slides in the Z direction, then, as illustrated in FIG. 6, the second protruding portion 14 of the terminal block 10 and the fitting groove portion 23b of the slide member 23 fit together, and also the locking portion 23a of the slide member 23, which had been fitted in the release position groove 20b, moves in the direction of the Z arrow as it flexes, to fit into the lock position groove 20c, to lock the terminal block 10 that is attached to the controlling device main unit 20.

Confirming the Locked State

In the state wherein the terminal block 10 is locked to the controlling device main unit 20, the permanent magnet 28 that is provided on the slide member 23 is in proximity to the Hall IC chip 29 of the printed substrate 25 that is contained within the controlling device main unit 20. As a result, a signal indicating that magnetism of permanent magnet 28 has been detected (the detection signal indicating whether or not there is magnetism) is outputted from the Hall IC 29.

The detection signals from the Hall IC 29, indicating whether or not there is magnetism, is sent to a controlling portion 27 that is mounted on the printed substrate 25. Note that the Hall IC 29 sins, to a controlling portion 27, a detection signal with a level of "1" if magnetism is detected, and send, to the controlling portion 27, a detection signal with a level of "0" if magnetism is not detected.

Figure 8:
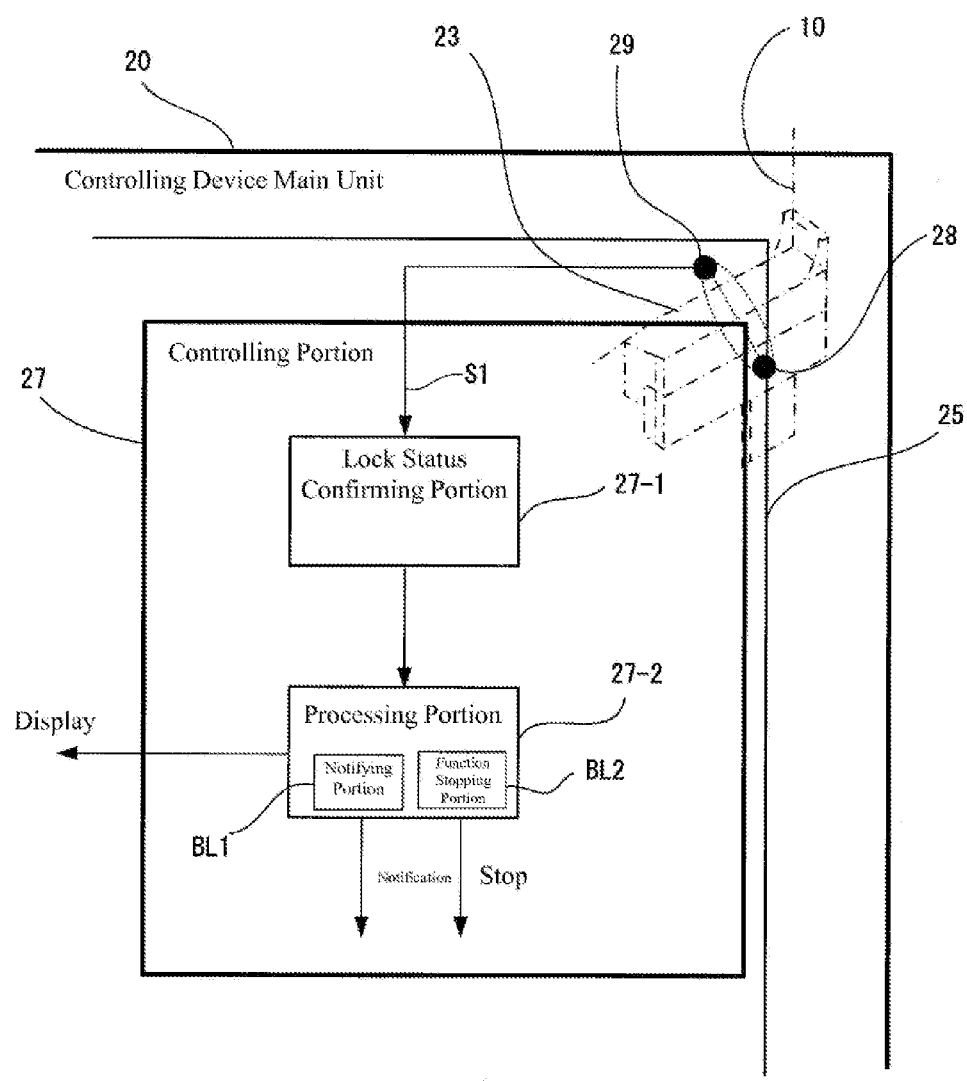
FIG. 8 is a functional block diagram of the controlling portion in the controlling device.

FIG. 8 shows a functional block diagram of the controlling portion 27. The controlling portion 27 is provided with a lock status confirming portion 27-1, for inputting a detection signal 51, indicating whether or not magnetism is present, sent from the Hall IC 29, and for confirming, based on the detection signal 51, whether or not terminal block 10 is in a locked state, and provided with a processing portion 27-2 for performing various types of processes upon receipt of the confirmation result from the lock status confirming portion 27-1.

In the controlling portion 27, the lock status confirming portion 27-1 evaluates that the terminal block 10 is in a locked state if the level of the detection signal 51 that is sent from the Hall IC 29 is "1", and if it is "0", determines that it is not in a locked state. In this case, the proximity of the permanent magnet 28 is detected so a detection signal 51 of the "1" level is sent from the Hall IC 29, and thus the lock status confirming portion 27-1 determines that the terminal block 10 is in the locked state. That is, it is confirmed that the terminal block 10 is in the locked state.

The confirmation result by the lock status confirming portion 27-1 is sent to the processing portion 27-2. The processing portion 27-2 not only sends the confirmation result from the lock status confirming portion 27-1 to the displaying portion 24 for display thereon, but also uses a communication function to send the confirmation result to a peripheral controlling device (external device), or the like, through a network or the Internet. Moreover, the processing portion 27-2, depending on the confirmation result by the lock status confirming portion 27-1, stops the function for various types of signal processing (communication, DI/DO, AI/AO) between the controlling portion 27 and the terminal block 10 if locked state of the terminal block 10 is not confirmed.

Note that in the processing portion 27-2, notification to an external device, or the like, of the confirmation result from the lock status confirming portion 27-1 is performed through a notifying portion BL1, and the stopping of the function for the various types of signal processing between the confirming portion 27 and the terminal block 10 is performed through a function stopping portion BL2.

In this way, given the controlling device 100 according to the present example, a permanent magnet 28 is provided in the slide member 23 and a Hall IC 29 is provided on the printed substrate 25 within the controlling device main unit 20, enabling detection of the status of the terminal block 10 as unlocked or locked, and enabling notification thereof.

Note that while in the example set forth above, the permanent magnet 28 was provided toward the bottom of the tip end portion of the slide member 23 in the slide direction, insofar as the permanent magnet 28 is provided in the slide member 23 there is no limitation to the location thereof being near the bottom of the tip end portion in the slide direction. Moreover, the Hall IC 29 that is provided facing the permanent magnet 28 is not limited to the position thereof being on the printed substrate 25 insofar as it is able to detect magnetism of the permanent magnet 28.

Moreover, it is anticipated that this type of controlling device 100 will be installed in a hostile environment, and that dust and dirt will become adhered thereto. In the present invention, the pair of the permanent magnet 28 and the Hall IC 29 is used to confirm that the terminal block 10 is in the locked state, thus enabling checking of the lock status of the terminal block 10 without making contact, doing so with superior environmental durability that is affected little by the surrounding dust and dirt, thus enabling the function for confirming the lock status of the terminal block 10 to be maintained stably over an extended period of time.

Extended Examples

While the present invention has been explained above in reference to examples, the present invention is not limited to the examples set forth above. The structures and details in the present invention may be varied in a variety of ways, as can be understood by one skilled in the art, within the scope of technology in the present invention.

The invention claimed is:
1. A controlling device comprising:
a controlling device main unit;
a terminal block that is attached removably to the controlling device main unit; and
a lock mechanism wherein the terminal block that is attached to the controlling device main unit is locked through movement of a slide member, wherein
the slide member includes
a permanent magnet disposed in a specific position, and the controlling device main unit includes
a magnetism detecting portion that detects magnetism of the permanent magnet, located in a location in proximity to the permanent magnet, disposed in the slide member, in a state wherein terminal block is locked through the movement of the slide member, and
a lock status confirming portion that confirms whether or not the terminal block is in a locked state, based on a detection signal from the magnetism detecting portion indicating whether or not magnetism is present, wherein
the controlling device main unit includes a function stopping portion that stops a function for various types of signal processing with the terminal block in response to a confirmation result from the lock status confirming portion if a status wherein the terminal block is locked is not confirmed.

* * * * *